United States Patent
Buehler et al.

(10) Patent No.: US 7,724,167 B2
(45) Date of Patent: May 25, 2010

(54) INTEGRATED CIRCUIT ARRANGEMENT, AND METHOD FOR PROGRAMMING AN INTEGRATED CIRCUIT ARRANGEMENT

(75) Inventors: Tobias Buehler, Graz (AT); Holger Haiplik, Swindon (GB); Thomas Jessenig, Klagenfurt (AT); Manfred Lueger, Preding (AT)

(73) Assignee: Austriamicrosystems AG, Unterpremstatten (AT)

( * ) Notice: Subject to any disclaimer, the term of this patent is extended or adjusted under 35 U.S.C. 154(b) by 450 days.

(21) Appl. No.: 10/558,149

(22) PCT Filed: Apr. 16, 2004

(86) PCT No.: PCT/EP2004/004079

§ 371 (c)(1),
(2), (4) Date: May 22, 2007

(87) PCT Pub. No.: WO2004/105246

PCT Pub. Date: Dec. 2, 2004

(65) Prior Publication Data

US 2007/0277141 A1    Nov. 29, 2007

(30) Foreign Application Priority Data

May 21, 2003    (DE) ................ 103 23 012

(51) Int. Cl.
*H03M 1/84* (2006.01)
(52) U.S. Cl. ..................... 341/138; 341/155
(58) Field of Classification Search ............. 341/155, 341/156, 164, 138, 114
See application file for complete search history.

(56) References Cited

U.S. PATENT DOCUMENTS

| | | | |
|---|---|---|---|
| 5,157,397 A | 10/1992 | Vernon | |
| 5,408,611 A | 4/1995 | Kim | |
| 5,608,341 A | 3/1997 | Andersson | |
| 5,758,108 A | 5/1998 | Nakamura | |
| 6,229,467 B1 * | 5/2001 | Eklund et al. | 341/120 |
| 6,351,175 B1 | 2/2002 | Rapp | |
| 6,359,578 B1 * | 3/2002 | Gee et al. | 341/155 |
| RE38,166 E * | 7/2003 | Calligaro et al. | 365/168 |
| 6,717,393 B2 * | 4/2004 | Male | 324/76.17 |
| 6,891,490 B2 * | 5/2005 | Hales | 341/155 |
| 7,132,849 B2 * | 11/2006 | Tucker et al. | 326/38 |

(Continued)

FOREIGN PATENT DOCUMENTS

DE    42 18 787    8/1993

(Continued)

OTHER PUBLICATIONS

Translation of International Preliminary Examination Report for Application No. PCT/EP2004/004079.

(Continued)

*Primary Examiner*—Peguy JeanPierre
(74) *Attorney, Agent, or Firm*—Fish & Richardson P.C.

(57) ABSTRACT

An integrated circuit includes a comparator having a first input, a second input, and an output for providing a comparison result. The first input is connected to a readable component having a predefined value, and the second input is connected to a reference component. A control unit is at the output of the comparator. The control unit controls at least one function block based on the comparison result.

16 Claims, 2 Drawing Sheets

U.S. PATENT DOCUMENTS

| | | |
|---|---|---|
| 7,301,347 B2 | 11/2007 | Dearn et al. |
| 2007/0096748 A1 | 5/2007 | Dearn et al. |
| 2007/0252567 A1 | 11/2007 | Dearn et al. |
| 2008/0224682 A1 | 9/2008 | Haiplik et al. |
| 2008/0252262 A1 | 10/2008 | Buhler et al. |
| 2008/0303502 A1 | 12/2008 | Haiplik et al. |
| 2009/0179589 A1 | 7/2009 | Buhler et al. |

FOREIGN PATENT DOCUMENTS

| | | |
|---|---|---|
| EP | 0 841 620 | 5/1998 |
| EP | 1 355 426 | 10/2003 |
| JP | 02-190901 | 7/1990 |
| JP | 03-051337 | 5/1991 |
| JP | 11-039883 | 2/1999 |
| JP | 2001-094412 | 4/2001 |

OTHER PUBLICATIONS

Examination report with English translation dated Aug. 5, 2008 for corresponding JP application 2006-508150.

* cited by examiner

INTEGRATED CIRCUIT ARRANGEMENT, AND METHOD FOR PROGRAMMING AN INTEGRATED CIRCUIT ARRANGEMENT

TECHNICAL FIELD

The present invention relates to an integrated circuit arrangement and a method for programming an integrated circuit arrangement.

BACKGROUND

After having been produced, conventional integrated switching circuits can only be operated in an operating mode for which they are intended.

However, it may be desirable to keep the same integrated component suitable for several different applications and to select the respective intended mode of operation only after is has been produced, for example even after the chip has been encapsulated or enclosed in a housing.

It may also be desirable to fix the voltage values of the supply voltages for individual function blocks, a selection of certain function blocks, or a power-on sequence for certain function blocks or their initialisation, for example as part of a power-on sequence.

The described programming of an integrated component might be fixed retroactively, for example by fuse banks, DIP switches or the like.

However, all such known measures are associated with relatively high expense. This undesirable expense may be due to an increased footprint on a circuit board, for example, or a large number of extra pins required on the chip.

SUMMARY

The object of the present invention is to create an integrated circuit arrangement that may be programmed with little effort after production, in other words, that may be placed in a desired operating mode. A further object of the invention is to define a method for programming an integrated circuit arrangement that may be conducted with little effort and which permits operation of the integrated circuit arrangement in an operating mode which may be selected after production.

In accordance with the invention, the object regarding the integrated circuit arrangement is solved by an integrated circuit arrangement having a comparator with a first input that is connected to a connector of the integrated circuit arrangement, designed for attaching an external, readable component with a value from a predefined value set, with a second input to which a reference component with a readable reference value is attached, and with an output, and a control unit that is coupled at the output of the comparator for controlling at least one function block of the integrated circuit arrangement depending upon a comparison result of the comparator.

According to the proposed principle, the programming of the integrated circuit arrangement, for example the selection of one of several predefined operating modes, is carried out in that an external, readable component is connected to the connector of the integrated circuit arrangement. This component has a readable value, for example a certain resistance value, which is compared with a reference value of a reference component. Depending on the comparison result, the integrated circuit arrangement is placed in a certain operating mode, or programmed, via the control unit.

The external, readable component is preferably a passive component.

By selecting the value of the external component attached to the connector of the integrated circuit arrangement, it is possible to choose from a practically infinite number of different, predefined programming configurations.

The principle described requires only one additional pin, that is a connector leg on an integrated circuit arrangement. In this way, the integrated circuit arrangement may be programmed with exceptionally little effort.

For example, in order to read the external, passive component a signal source may be provided in the integrated circuit arrangement, generating a reference signal with which the external, readable component is charged.

The additional connector on the external, readable component is preferably connectable to a reference potential connector, for example earth.

The comparator, which compares the value of the external, readable component with the value of the reference component, preferably includes an analogue/digital converter for outputting the comparison result in digital form.

For example, an A/D converter may be provided with a resolution of 3 bits, so that a total of 8 different operating states may be activated simply by selecting the value of the readable component to be attached.

In accordance with a preferred embodiment of the circuit arrangement, the analogue/digital converter has a logarithmic characteristic curve. Thus the tolerance requirements for the external, readable component and the tolerance requirements for further processing of the value read out are significantly reduced. For example, a resistor with a tolerance of 30% used as an external readable component may still be read out reliably and may reliably select one from among several predefined operating modes due to the logarithmic characteristic curve.

The reference component may be provided as an external, attachable component or as an integrated component on the circuit arrangement.

In integrated circuit arrangements, an external reference component is often provided anyway to generate highly precise reference signals, for example bias currents, and is attached to a connector pin in the integrated circuit arrangement. This may be a reference resistor for example, or an external filter capacitor. If this is the case, this component may also be used as a reference component for programming in accordance with the proposed principle. To determine the comparison result, the reference component may preferably also be charged with the reference signal emitted by the signal source, and the value of the reference component may be read.

An external reference component has lower tolerances than an integrated reference component.

On the other hand, the design of the reference component as an integrated component is particularly advantageous if an external reference component is not essential to ensure correct functioning of the integrated arrangement and/or if an especially small number of pins is necessary.

The reference component and the readable programming component may have the form of a resistor or a capacitor, for example. However, other passive components that have a readable physical value may also be used.

The integrated circuit arrangement may include a plurality of function blocks, wherein the control unit is able to address these function blocks with different supply voltages, reference voltages and/or power-on sequence depending on the comparison result from the comparator.

A volatile memory, known as a latch, is preferably switched between the output of the comparator and the control unit to buffer the comparison result from the comparator.

The readable value is read out from the external, readable component and this value is compared with the value of the reference component preferably during a power-on phase of the integrated circuit arrangement. In order to ensure that the comparison result is available for the entire operating time of the integrated circuit arrangement, it is advantageous to buffer it.

In order to be able to specify the many predefined operating modes, of which each may be determined by selecting the value of the external readable component, a memory block is preferably provided to store control parameters for the respective modes of operation. This memory block is coupled with the control unit in such manner that one of the stored operating modes is activated depending on the comparison result from the comparator.

The memory block is preferably configured as a boot ROM (Read Only Memory) and is read out when the integrated circuit arrangement is switched on.

In order to gain additional flexibility, the boot ROM may be programmable, for example, by selecting the masks for the metallization planes of the programmable boot ROM during production.

The principle described may preferably be applied in power management units (PMU) to control the power-on sequence. The various, predefinable sequences may be stored in the ROM and defined, and are selected in the application by the value of the programming, readable component.

Flexibility is further increased if a programmable ROM is provided with zener or poly fuses, that is to say programmable connections, instead of the metal-mask programmable ROM. With fuses or anti-fuses of such kind, the conductivity status of the fuse is fixed by charging it with an energy pulse, wherein the conductivity status may be switched between high impedance and low impedance.

If the reference component has the form of an integrated component, it may be advantageous to increase the precision via a simple device that allows balancing of the integrated reference component.

In order to activate the signal source and the comparator after the integrated circuit arrangement is switched on, it may be advantageous to provide an activation circuit, which is coupled with the respective activation inputs of comparator and/or signal source. The activation circuit is configured to activate the comparator and, if necessary, the signal source after the integrated circuit has been switched on, and switches it off again as soon as the comparison is complete, with analogue/digital converter as necessary and the comparison result has been stored.

Regarding the method, the object is solved by a method for programming an integrated circuit arrangement, including the following method steps:

reading of the value of an external component connected to the integrated circuit arrangement, comparison of the value read out with a reference value and determination of a comparison result, emission of a selection signal to control the integrated circuit depending on the comparison result.

According to the proposed procedure, an external, readable component is attached to the integrated circuit arrangement and then the value of this external readable component is read out. This value is then compared with the value that has also been read out from a reference component, that is to say a reference value, and a comparison result is determined. Depending on this comparison result, a selection signal is emitted to control the integrated circuit.

The integrated circuit arrangement is preferably placed in one of several predefined operating states depending on the selection signal.

The reference value is preferably determined by reading out from an external or integrated reference component. The reference value and the value of the external readable component are preferably compared using an analogue/digital converter. The values of the readable external component and of the reference component are preferably read by charging them with a reference signal provided by a signal source during a power-on process of the integrated circuit arrangement.

After it has been calculated, the comparison result is preferably stored in a volatile memory so that it is also available after the power-on process.

It is further preferred if the comparison is activated during a power-on process and then the comparator, which carries out the comparison, and possibly the signal source, which is used to read out the readable component values, are deactivated again.

The reference signal provided by the signal source may be a reference voltage or a reference current, for example.

If an external reference resistor, or an external filter capacitor or similar external passive component, is already provided in the integrated circuit arrangement described, this may preferably be used as the reference component. In this case, two pins are provided, to which the external readable component and the reference component may be connected respectively. The free ends of such passive components are preferably connected to a reference potential connection, for example earth.

With the method described, the integrated circuit arrangement may easily be placed in one of several predefined operating modes according to the value of a passive component that is attachable to a pin of the integrated circuit arrangement.

Additional details and advantageous embodiments of the proposed principle will be apparent from the subordinate claims.

The invention will be explained in greater detail in the following with reference to several embodiments in the drawing.

DETAILED DESCRIPTION

In the following description of the figures, similar or equivalent components are provided with the same reference numbers.

Figure 1:
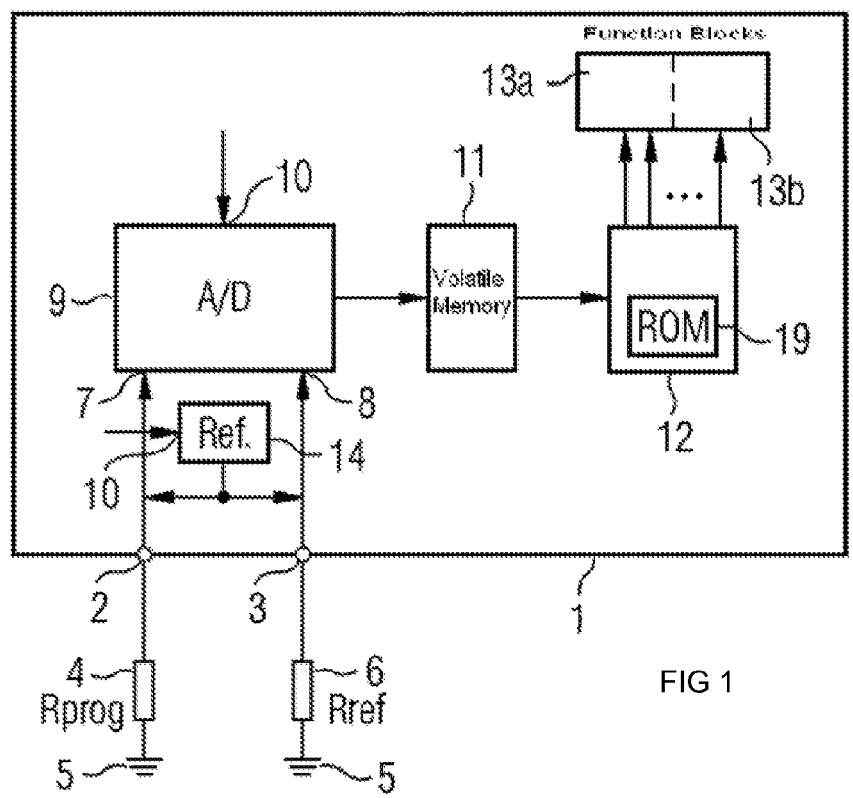
FIG. 1 shows a first embodiment of an integrated circuit arrangement with two external resistors in accordance with the invention.

FIG. 1 shows an integrated circuit arrangement 1, which is furnished among other things with two connectors 2, 3, referred to as pins. An external readable component in the form of a resistor 4 to a reference potential connection 5 is switched to connector 2 of integrated circuit arrangement 1. As will be described later in more detail, resistor 4 serves to program circuit arrangement 1. A further resistor 6, which is also switched against reference potential connection 5, is connected to connector 3 and serves as a reference component. Connectors 2, 3 of circuit arrangement 1 are connected internally with a first and second input 7, 8 respectively of a comparator 9. Comparator 9 includes an analogue/digital converter. Comparator 9 has an activation input 10 for activating comparator 9 during a power-on phase. A control unit 12 controls several function blocks 13a, 13b in circuit arrangement 1, and is connected via a volatile memory 11 to the digital output of the A/D converter, which constitutes the output of comparator 9.

A signal source 14, which is designed to generate a reference signal and is connected to connectors 2, 3 of the circuit arrangement, is also provided.

Reference component 6 serves not only as the reference component for comparator 9 in accordance with the proposed principle, but also as the reference resistor for generating a bias signal, which is essential anyway so that a least one of the function blocks 13a, 13b is able to operate.

When comparator 9 and signal source 14 are activated via activation input 10 in a power-on phase of the circuit arrangement, readable, programming resistor 4 and reference resistor 6 are charged with a reference signal, which is generated by the reference source 14, thus with a reference voltage or a reference current. Comparator 9 compares the signals that are incident on its inputs 7, 8, which of course depend on the component values Rprog, Rref of resistors 4, 6. The A/D converter determines the relationship of values Rprog, Rref of the two external components 4, 6 and outputs a corresponding comparison result in digital form at the output. This comparison result is stored in buffer memory 11. Then, comparator 9 with the A/D converter and signal source 14 are deactivated.

With the comparison result stored in buffer memory 11, control unit 12 is now able to control function blocks 13a, 13b of the circuit arrangement. According to the proposed principle, this occurs depending on the value of programming resistor 4.

All that is required to carry out the proposed principle is one additional pin 2 on chip 1, since resistor 6 on pin 3 is essential anyway as a reference resistor. Additional resistor 4 may be a simple and inexpensive external resistor, and is not required to meet excessively stringent tolerances. Various programming configurations or operating modes of the circuits on chip 1 may be selected by selecting the order of resistance of resistance component 4.

The tolerance precision requirements for resistor 4 may be further reduced if the A/D converter in comparator 9 has a logarithmic characteristic curve.

A large number of parameters for each adjustable mode of operation, such as supply voltage levels for certain function blocks 13a, 13b, reference voltage levels, power-on sequences, etc. is advantageously stored in the boot ROM in control unit 12. The boot ROM is designed to be programmable by varying the metallization masks. This ROM is addressed by the result of comparator 9. The available power-on sequences, of which one may be selected with resistor 4, are accordingly defined by metallization masks and are selected in the application by the value of programming module 4.

Even greater flexibility may thus be achieved if the ROM is realized in control unit 12 as a programmable ROM and is equipped with zener or polysilicon fuses for this purpose.

The described principle is applicable in especially advantageous manner for controlling the power-on sequence in power management units (PMU).

Figure 2:
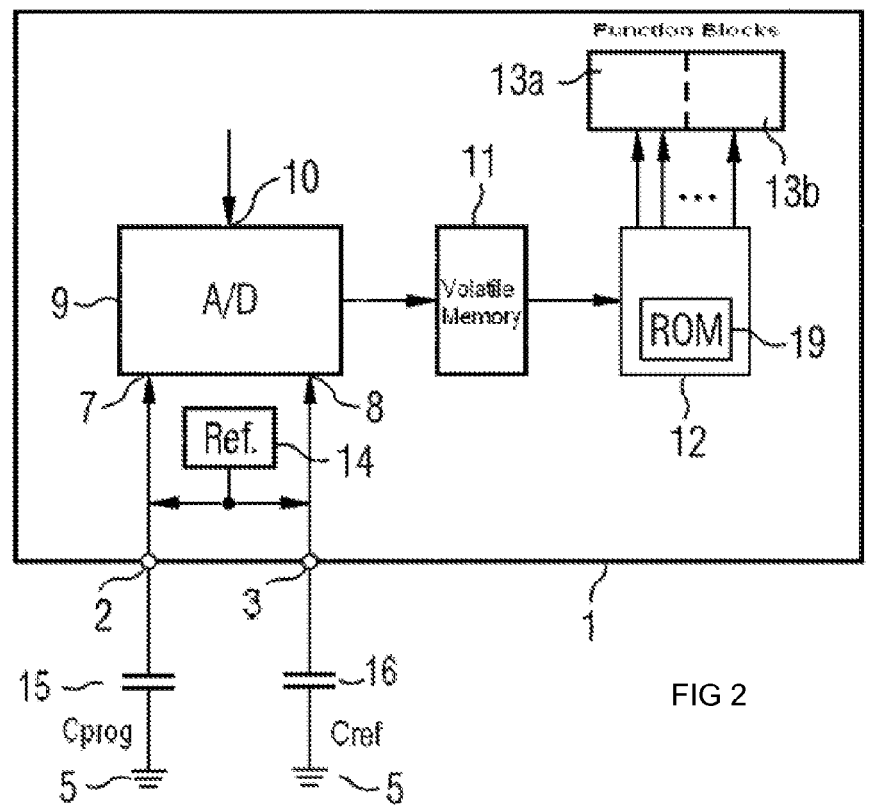
FIG. 2 shows a second embodiment of an integrated circuit arrangement with two external capacitors in accordance with the invention.

FIG. 2 shows an alternative embodiment of the integrated circuit arrangement of FIG. 1. The circuit of FIG. 2 largely matches that of FIG. 1 in terms of its construction and advantageous functioning and to that extent does not need to be described again here. However, a programming capacitor 15 and reference capacitor 16 are provided instead of programming resistor 4 and reference resistor 6 in the circuit in FIG. 2. They are also switched between external connectors 2, 3 of chip 1 and reference potential 5.

Reference capacitor 16 is provided anyway as a filter capacitor on chip 1 of FIG. 2, in order to operate at least one function block 13a, 13b.

Capacitors 15, 16 are charged at input 10 via signal source 14 upon activation of comparator 9 and signal source 14, and the signals that are created, which are incident at inputs 7, 8 of comparator 9 and depend on the capacitances Cprog, Cref of capacitors 15, 16, are evaluated by the comparator. The rest of the mode of operation is largely the same as that explained with reference to FIG. 1.

Figure 3:
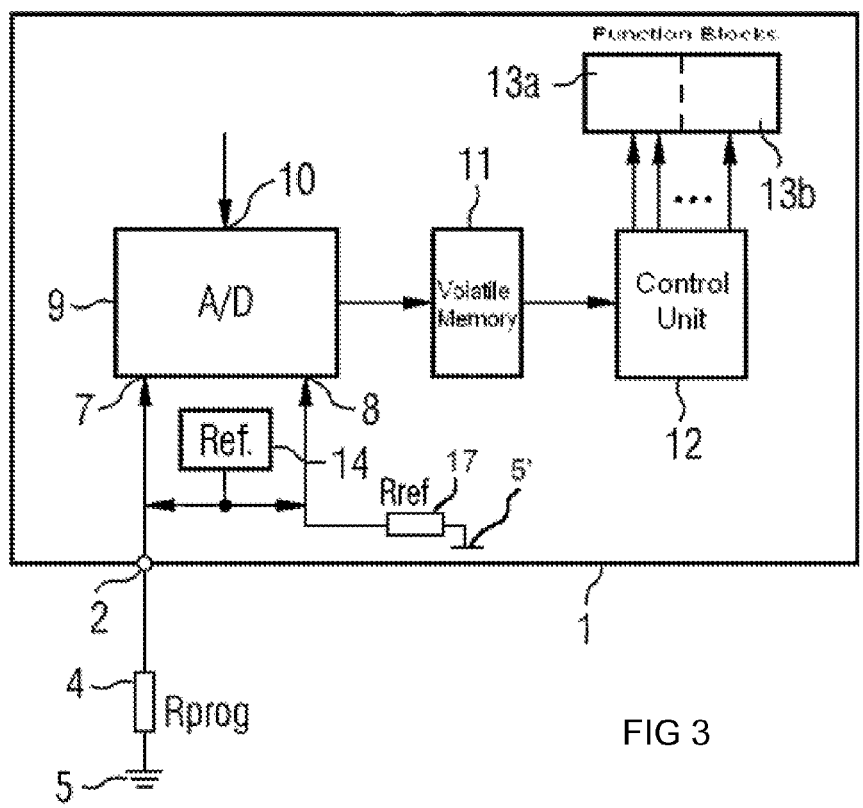
FIG. 3 shows a third embodiment of an integrated circuit arrangement with an external resistor in accordance with the invention and FIG. 4 shows a fourth embodiment of an integrated circuit arrangement with an external capacitor in accordance with the invention.

FIG. 3 shows an alternative embodiment to FIG. 1, which is largely the same as FIG. 1 in terms of construction and advantageous functioning. To that extent, the description of the figure will not be repeated here. In the embodiment in accordance with FIG. 3, an integrated reference resistor 17, which is switched between input 8 of comparator 9 and an internal reference potential connection 5', is provided in place of external reference resistance 6. Thus the external connector pin 3 on chip 1 may be dispensed with.

The embodiment described has the advantage that fewer pins are required on the chip and is therefore used preferably when an external reference component is not required, for example, to generate a precise reference signal or as a filter component.

Figure 4:
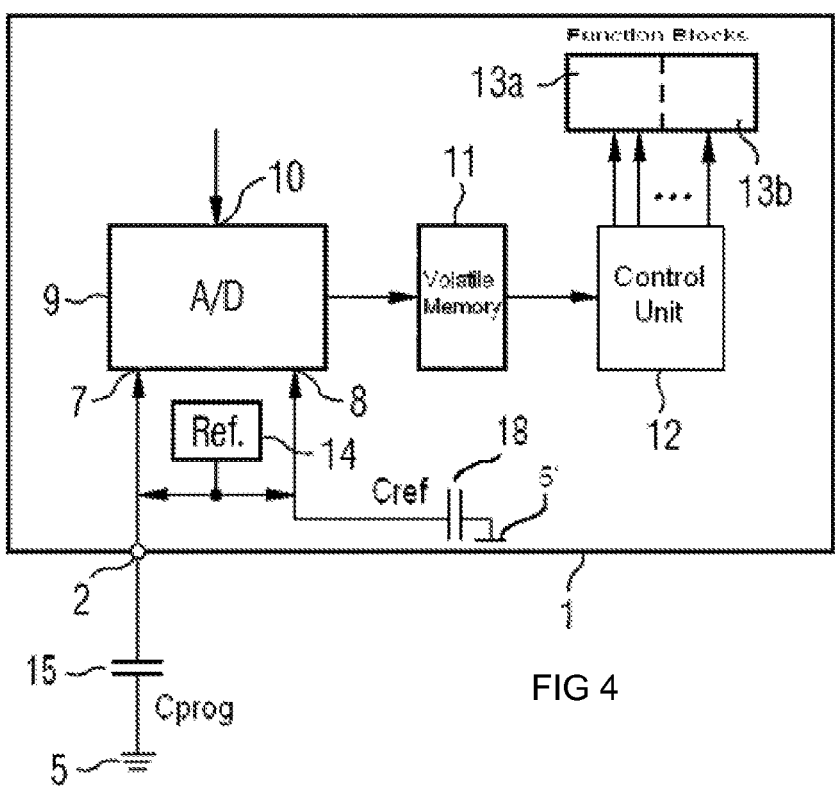

FIG. 4 shows an alternative embodiment of the circuit of FIG. 2. In the circuit of FIG. 4, an integrated capacitor 18 is provided instead of the external reference capacitor 16 of FIG. 2. Capacitor 18 is switched between input 18 of comparator 9 and reference potential 5'.

As in FIG. 3, one pin is omitted, namely pin 3. The embodiment shown is used advantageously when no external filter capacitor is needed as a reference component.

If reference components 17, 18 of FIGS. 3, 4 are exposed to large production fluctuations in terms of their component values, it may be advantageous to provide a balancing capability for balancing the respective internal, passive reference component 17, 18.

Other passive components may also be provided as a reference component and a programming, readable component instead of the resistors and capacitors shown in the exemplary embodiments.

The preceding description of the embodiments according to the present invention is used purely for illustrative purposes and is not intended to limit the invention. Various changes and modifications are possible within the terms of the invention, without exceeding the scope of the invention or its equivalents.

The invention claimed is:

1. An integrated circuit comprising:
a comparator comprising a first input, a second input, and an output for providing a comparison result, the first input being connected to a readable component having a predefined value, the second input being connected to a reference component, the comparison result corresponding to a comparison of the predefined value and a reference value that is based on the reference component;

a control unit in a circuit path at the output of the comparator, the control unit for controlling at least one function block based on the comparison result;

a first pin between the readable component and the first input;

a second pin between the reference component and the second input; and a signal source for generating a reference signal, the signal source being coupled between the first input and the second input.

2. The integrated circuit of claim 1, wherein the readable component is connected to a reference potential.

3. The integrated circuit of claim 1, wherein the comparator comprises an analog-to-digital converter for outputting the comparison result, the comparison result comprising a digital output.

4. The integrated circuit of claim 3, wherein the analog-to-digital converter has a logarithmic characteristic curve.

5. The integrated circuit of claim 1, wherein the reference component is external relative to other components of the integrated circuit.

6. The integrated circuit of claim 1, wherein the reference component comprises an integrated component.

7. The integrated circuit arrangement of claim 1, further comprising:
a memory in the circuit path and between the output of the comparator and the control unit, the memory storing the comparison result temporarily.

8. The integrated circuit of claim 1, further comprising:
at least one function block, the at least one function block being coupled to, or part of, the control unit; and
a memory block for storing control parameters for several modes of operation of the at least one function block, wherein at least one of the modes of operation is controlled based on the comparison result.

9. The integrated circuit of claim 1, wherein the comparator comprises an activation input for receiving a signal to activate the comparator after the integrated circuit is turned on.

10. An integrated circuit comprising:
a comparator comprising a first input, a second input, and an output for providing a comparison result, the first input being connected to a readable component having a predefined value, the second input being connected to a reference component, the comparison result corresponding to a comparison of the predefined value and a reference value that is based on the reference component; and a control unit in a circuit path at the output of the comparator, the control unit for controlling at least one function block based on the comparison result;

wherein the reference component and the readable component comprise resistors or comprise capacitors.

11. An integrated circuit comprising:
a comparator comprising a first input, a second input, and an output for providing a comparison result, the first input being connected to a readable component having a predefined value, the second input being connected to a reference component, the comparison result corresponding to a comparison of the predefined value and a reference value that is based on the reference component;

a control unit in a circuit path at the output of the comparator, the control unit for controlling at least one function block based on the comparison result; and function blocks that are controlled by the control unit, the control unit for controlling supply voltage, reference voltage and/or power-on sequence of at least one of the function blocks.

12. A method of programming an integrated circuit, comprising:
obtaining a value of an external component connected to the integrated circuit;
comparing the value to a reference value to obtain a comparison result; and
outputting a signal to control the integrated circuit, the signal being based on the comparison result;
wherein the signal controls the integrated circuit by putting the integrated circuit in a predefined mode of operation that is selected from a set of predefined modes of operation.

13. The method of claim 12, wherein the value of the external component is obtained by applying a reference signal to the external component.

14. The method of claim 12, wherein the reference value corresponds to a value of a reference component with a reference signal applied thereto.

15. The method of claim 12, wherein the comparison result is obtained during a power-on process of the integrated circuit and is stored temporarily in a memory.

16. The method of claim 15, wherein the memory comprises a volatile memory.

* * * * *